United States Patent [19]
Dearnaley

[11] Patent Number: 5,391,407
[45] Date of Patent: Feb. 21, 1995

[54] PROCESS FOR FORMING PROTECTIVE DIAMOND-LIKE CARBON COATINGS ON METALLIC SURFACES

[75] Inventor: Geoffrey Dearnaley, San Antonio, Tex.

[73] Assignee: Southwest Research Institute, San Antonio, Tex.

[21] Appl. No.: 215,468

[22] Filed: Mar. 18, 1994

[51] Int. Cl.$^6$ .............................. B05D 3/06
[52] U.S. Cl. .................. 427/527; 427/528; 427/531; 427/533
[58] Field of Search ............ 427/523, 525, 527, 528, 427/531, 533, 249, 305, 438, 566, 567; 423/446; 204/192.3

[56] References Cited

U.S. PATENT DOCUMENTS

| | | | |
|---|---|---|---|
| 4,554,208 | 11/1985 | MacIver et al. | 427/525 |
| 4,634,600 | 1/1987 | Shimizu et al. | 427/566 |
| 5,009,923 | 4/1991 | Ogata et al. | 427/533 |

Primary Examiner—Terry J. Owens
Attorney, Agent, or Firm—Rosenblatt & Associates

[57] ABSTRACT

Process for forming diamond-like carbon coatings on metal surfaces to produce increased resistance to penetration, abrasion, and corrosion. A Ni/P coating is formed on an uncoated metal workpiece by electroless deposition. While the workpiece is heated to harden the Ni/P coating, a vaporized stream of silicon is directed onto the Ni/P coating and the stream of silicon over the Ni/P coating is bombarded with an ion beam such that a $NiSi_2$ layer is formed at the interface of the Ni/P coating and silicon and a silicon overlayer is formed over the $NiSi_2$ layer. A vaporized stream of carbon-containing precursor molecules is directed onto the silicon overlayer such that a film of the precursor molecules condenses on the silicon overlayer. The film of precursor molecules is bombarded with an ion beam sufficiently to form a layer of diamond-like carbon on the silicon overlayer. A Ni/B solution or Ni/SiC solution can be used instead of the Ni/P solution, and germanium can be used instead of silicon.

23 Claims, 6 Drawing Sheets

PROCESS FOR FORMING PROTECTIVE DIAMOND-LIKE CARBON COATINGS ON METALLIC SURFACES

BACKGROUND OF THE INVENTION

1. Field of the Invention

This invention involves a process for coating a metal surface to produce increased resistance to penetration, abrasion and corrosion. The process comprises the electroless deposition of nickel, the ion beam deposition of silicon, and the deposition of a diamond-like carbon (DLC) coating.

2. Description of the Prior Art

Metal surfaces have long been coated in order to protect such surfaces from wear, abrasion, and corrosion. Chromium has been used in the prior art as a coating for metal surfaces. Prior art methods have employed the electrodeposition of hard chromium from a chromate bath to coat metal surfaces. The resulting chromium coating has a hardness greater than that of tool steels and further has a very high resistance to both general and pitting corrosion. Such corrosion frequently occurs in a marine or chloride-containing environment.

Chromium coatings applied by electrodeposition have also been used to refurbish or restore a worn metal surface to its original dimensions. The use of chromium for refurbishment has involved stripping the residual chromium coating from the worn workpiece, applying a layer of hard chromium by electrodeposition and machining the workpiece to provide a wear-resistant surface within the desired dimensional tolerances.

Although the use of hard chromium has been satisfactory in terms of protecting the underlying metal surface, the use of hexavalent chromium electrolyte, required for electrodeposition, is environmentally undesirable. Hexavalent chromium electrolyte is toxic. Environmental regulations enacted by the United States Environmental Protection Agency (EPA) severely restrict the use of toxic hexavalent chromium electrolyte for use as a restorative coating.

No prior art method has been devised to provide a coating for a metallic surface with the wear resistant and corrosion resistant characteristics of a hard chromium coating, without the adverse environmental effects resulting from the electrodeposition of hard chromium.

SUMMARY OF THE INVENTION

The present invention overcomes the problems of the prior art by providing an environmentally acceptable method of coating a metal surface such that it will have the wear and corrosion resistance of a hard chromium surface. The present invention is useful in providing such a wear resistant and corrosion resistant coating within desired dimensional tolerances. The present invention can be employed to restore a worn workpiece to its preexisting dimensional tolerances.

The present invention comprises the step of immersing a metal workpiece with an uncoated metal surface in a nickel/phosphorus (Ni/P) solution heated to a sufficient temperature for the electroless deposition of a Ni/P coating to occur on the metal surface. Where the workpiece has a prior coat on it, that coating should be stripped off. In cases where the workpiece is pitted or uneven, its metal surface should be ground or filed to a smooth finish using grinding and polishing techniques well known in the machining arts.

The present invention further comprising the step of placing the workpiece in a vacuum chamber and heating the workpiece to approximately 315° C. for a sufficient amount of time to harden the Ni/P coating. Simultaneous with the heating of the workpiece, a stream of vaporized silicon is directed onto the Ni/P coating and the stream of silicon over the Ni/P coating is simultaneously bombarded with an ion beam at an energy level of 200 eV–100 KeV for a sufficient amount of time for (1) a layer of nickel disilicide ($NiSi_2$) to form at the interface of the Ni/P coating and the silicon, and (2) a silicon overlayer to form above the $NiSi_2$ interface layer. The $NiSi_2$ interface layer serves the function of bonding the silicon overlayer to the Ni/P coating.

In an alternative embodiment, a vaporized stream of germanium is used in place of a vaporized stream of silicon. This results in the formation of a layer of $NiGe_2$, instead of $NiSi_2$ and the formation of a germanium overlayer, instead of a silicon overlayer.

In another embodiment to the present invention, electroless nickel is strengthened with the addition of boron rather than phosphorus. In this embodiment, the workpiece is immersed in a nickel/boron (Ni/B) solution and heated to a sufficient temperature for the electroless deposition of a Ni/B coating to occur on the metal surface. The workpiece is further heated, as described above, for a sufficient amount of time to harden the Ni/B coating. In this embodiment, it is preferred that the boron concentration of the solution be 5 atomic percent boron by weight.

In yet another embodiment of the present invention, electroless nickel is strengthened with the addition of silicon carbide (SIC) particles in a nickel/silicon carbide (Ni/SiC) solution. The workpiece is immersed in a Ni/SiC solution and heated, as described above. In a preferred embodiment, the Ni/SiC solution is 35% SiC by volume and comprises solid suspended silicon carbide particles, preferably about 1 micron in size.

The present invention further comprises the step of directing a vaporized stream of carbon containing precursor molecules onto the surface of the silicon overlayer for a sufficient amount of time to allow a film of precursor molecules to condense on the silicon overlayer. The film of precursor molecules is then bombarded with an ion beam of sufficient energy level and for a sufficient amount of time to break a substantial number of carbon-to-carbon and carbon-to-hydrogen bonds in the precursor molecules to result in the formation of a DLC coating on the outer surface of the workpiece. The breaking of carbon-to-hydrogen bonds permits the migration and diffusion of hydrogen from the precursor material. The breaking and remaking of carbon-to-carbon bonds, permits the carbon atoms to form an amorphous diamond-like carbon lattice structure.

BRIEF DESCRIPTION OF THE DRAWINGS

FIGS. 1A–D are block diagrams of the process embodiments of the present invention.

Figure 3:
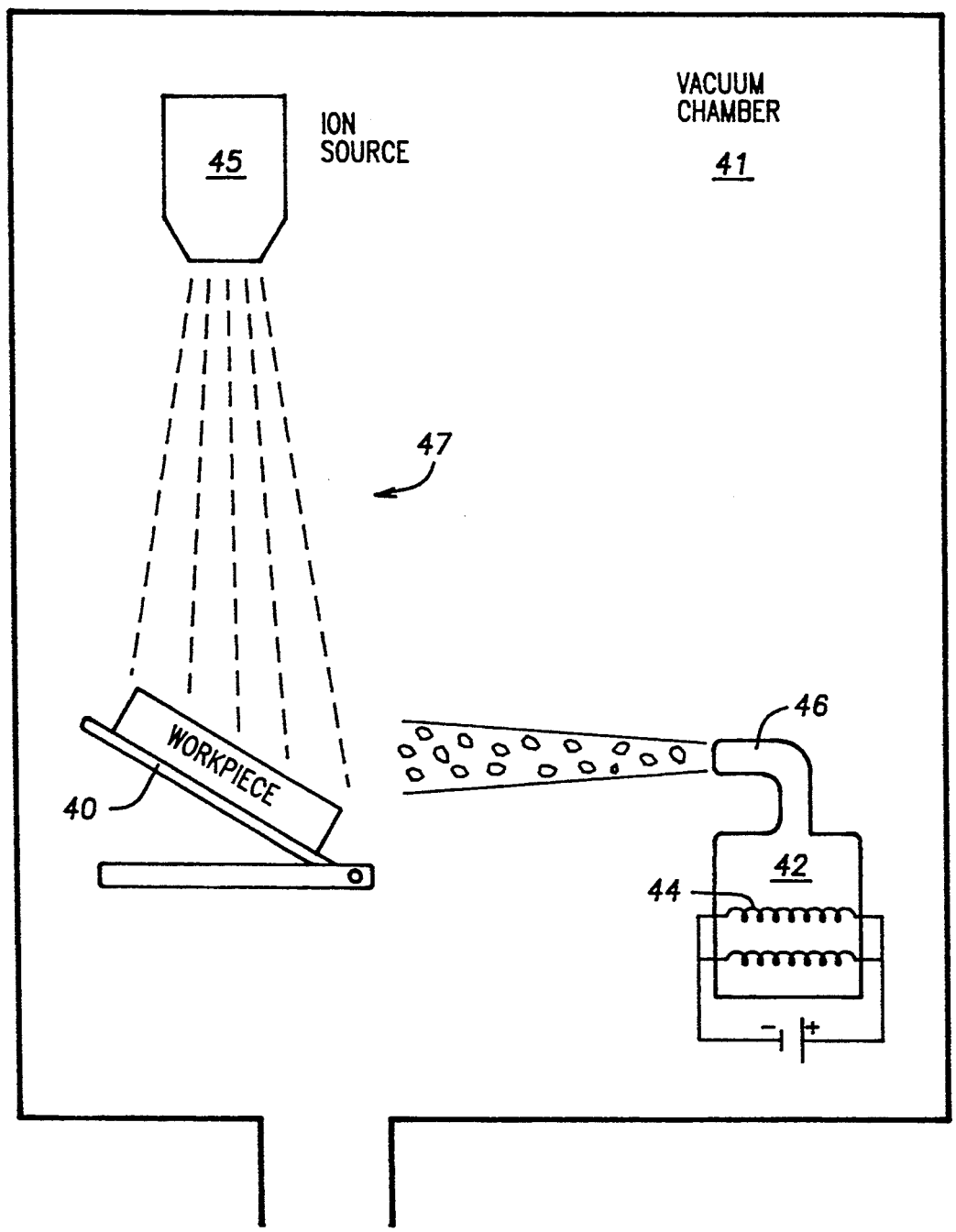
FIG. 3 is a nonscale diagram of an apparatus that can be used to simultaneously direct a vaporized stream of precursor molecules toward the workpiece and bombard the workpiece with an ion beam, as required by the present invention.
Figure 2:
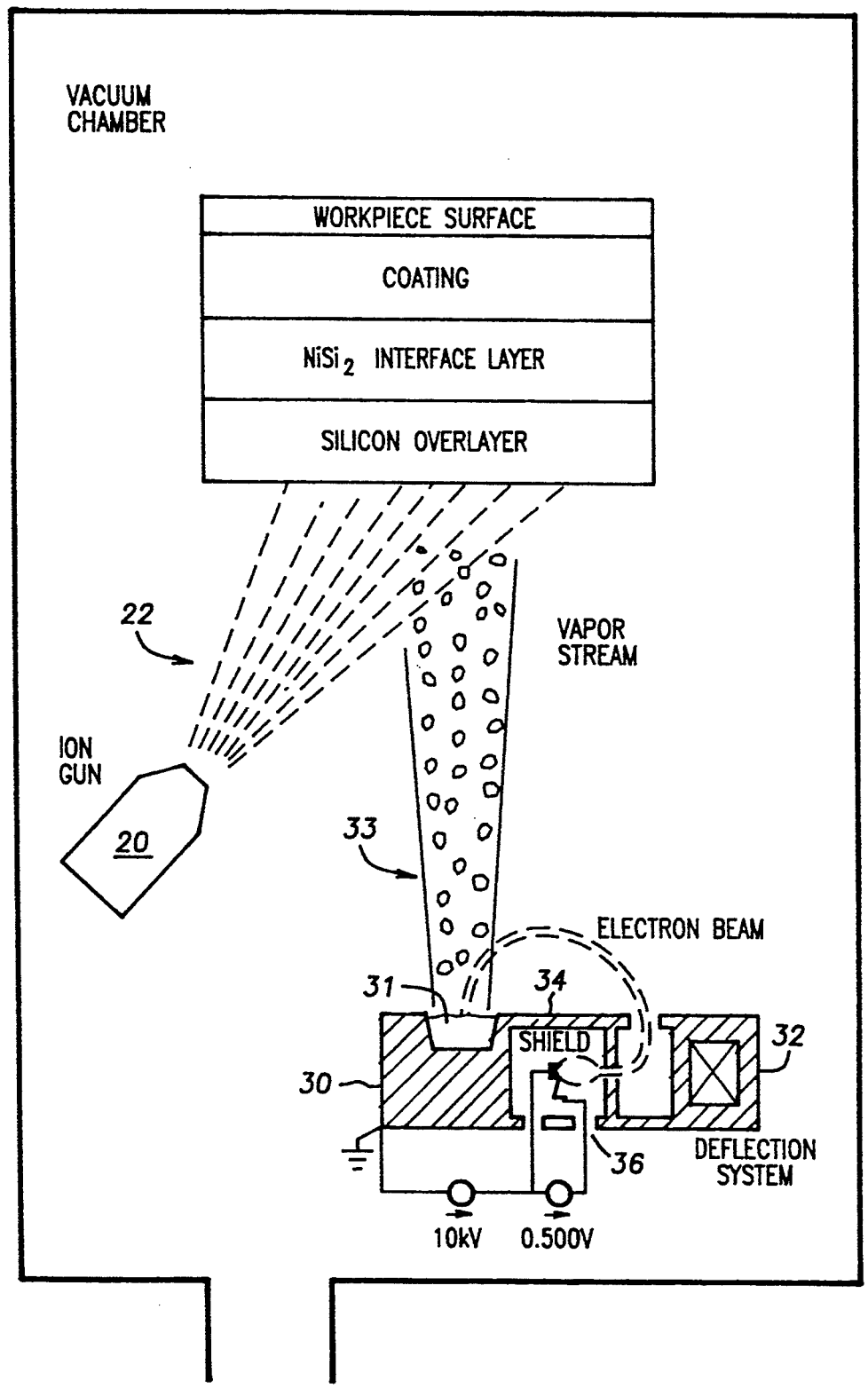
FIG. 2 is a nonscale diagram of an apparatus that can be used to simultaneously bombard a workpiece with an ion beam and direct a vaporized stream of silicon toward a workpiece, as required by the present invention.
Figure 3:
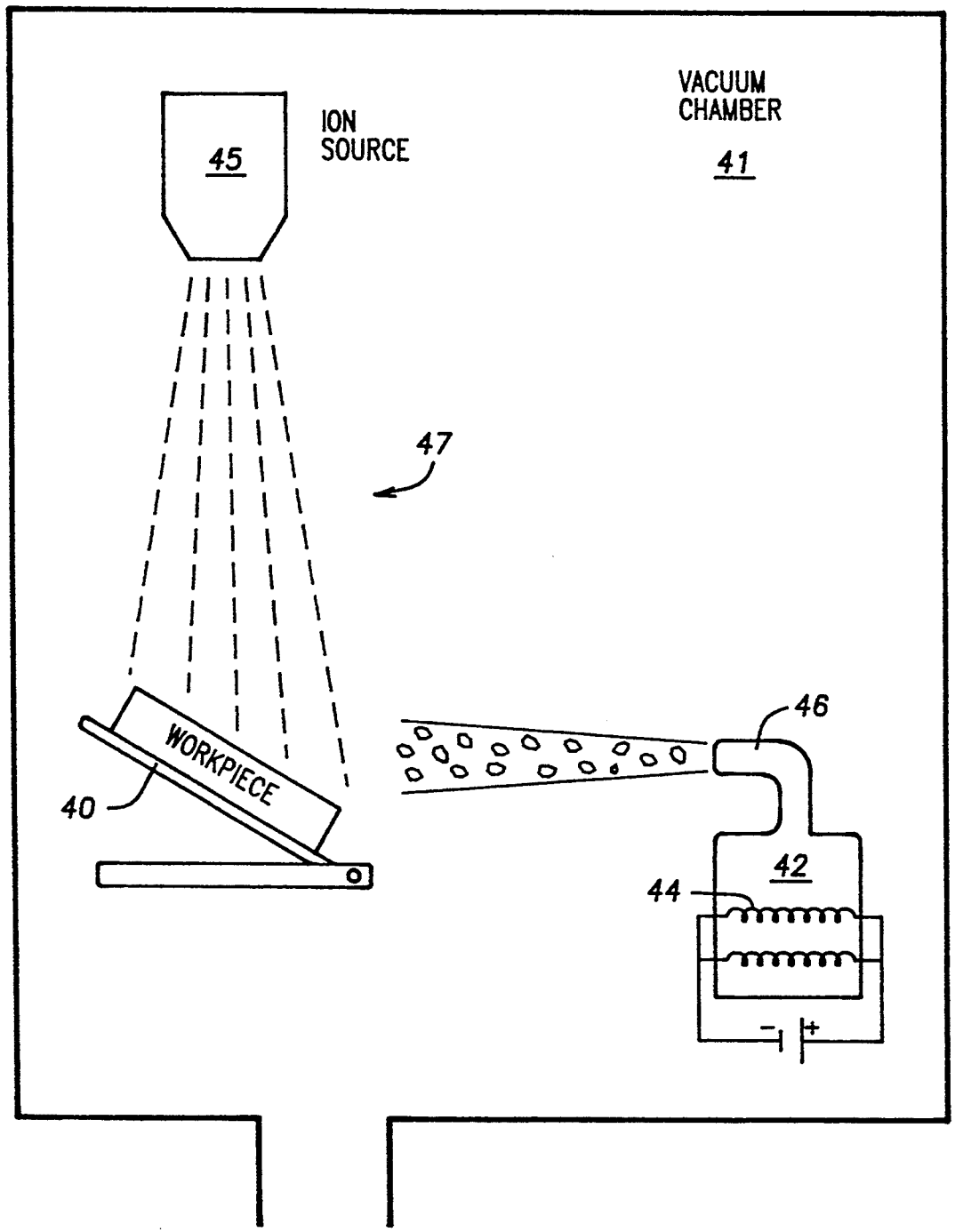

It is understood by those of ordinary skill in the art that ion beams, molecular vapor streams, and atomic layers of the type described herein, are too small to be seen with the naked eye and that the depiction of these things in FIGS. 2-3 is exaggerated in size and simplified in shape for illustrative purposes.

DESCRIPTION OF THE PREFERRED EMBODIMENTS

The present invention is directed toward a method or process for coating a metal surface. This method is depicted in block diagram form in FIG. 1A. The first step of this method is immersing a metal workpiece comprising an uncoated metal surface in a Ni/P solution heated to a sufficient temperature for the electroless deposition of a Ni/P coating to occur on the metal surface, as shown in block 10A of FIG. 1A. In a preferred embodiment of the present invention, the Ni/P solution is 3-12% phosphorus by atomic weight. The optimum phosphorus percentage within this range for practicing the present invention is 10%.

In one embodiment of the present invention, a copper underlay is applied to the workpiece through the electroless deposition of copper, prior to the electroless deposition of nickel. In another embodiment of the present invention, an electrodeposited nickel underlay is applied to the workpiece.

In some cases, a metal workpiece must first be stripped of any prior coating before it is immersed in the Ni/P solution. The preferred method of stripping the prior coating is by machining, because machining avoids the use of environmentally hazardous chemicals. Machining also enables one to establish the physical dimensions of the workpiece.

The Ni/P solution preferably comprises nickel sulfate, sodium hypophosphite, amino-acetic acid, acetic acid and filtered water. In a preferred embodiment, the Ni/P solution comprises 45 grams/liter of nickel sulfate, 10 grams/liter of sodium hypophosphite, 40 grams/liter of amino-acetic acid, and 10 grams per liter of acetic acid. The remainder of Ni/P solution, in a preferred embodiment, is filtered water.

It is known to those skilled in the plating art that a Ni/P solution of the preferred composition, results in a plating rate of approximately 1 mil per hour when the solution is heated to approximately 93° C. Thus, in practicing the first step of the present invention, the thickness of the Ni/P coating can be regulated by controlling the chemistry and temperature of the solution and the time of immersion.

The percentage of phosphorus in the Ni/P solution is primarily a function of the concentration of sodium hypophosphite in the solution, the solution temperature, and solution pH. The pH of the solution should preferably be approximately 4.5.

Figure 1A:
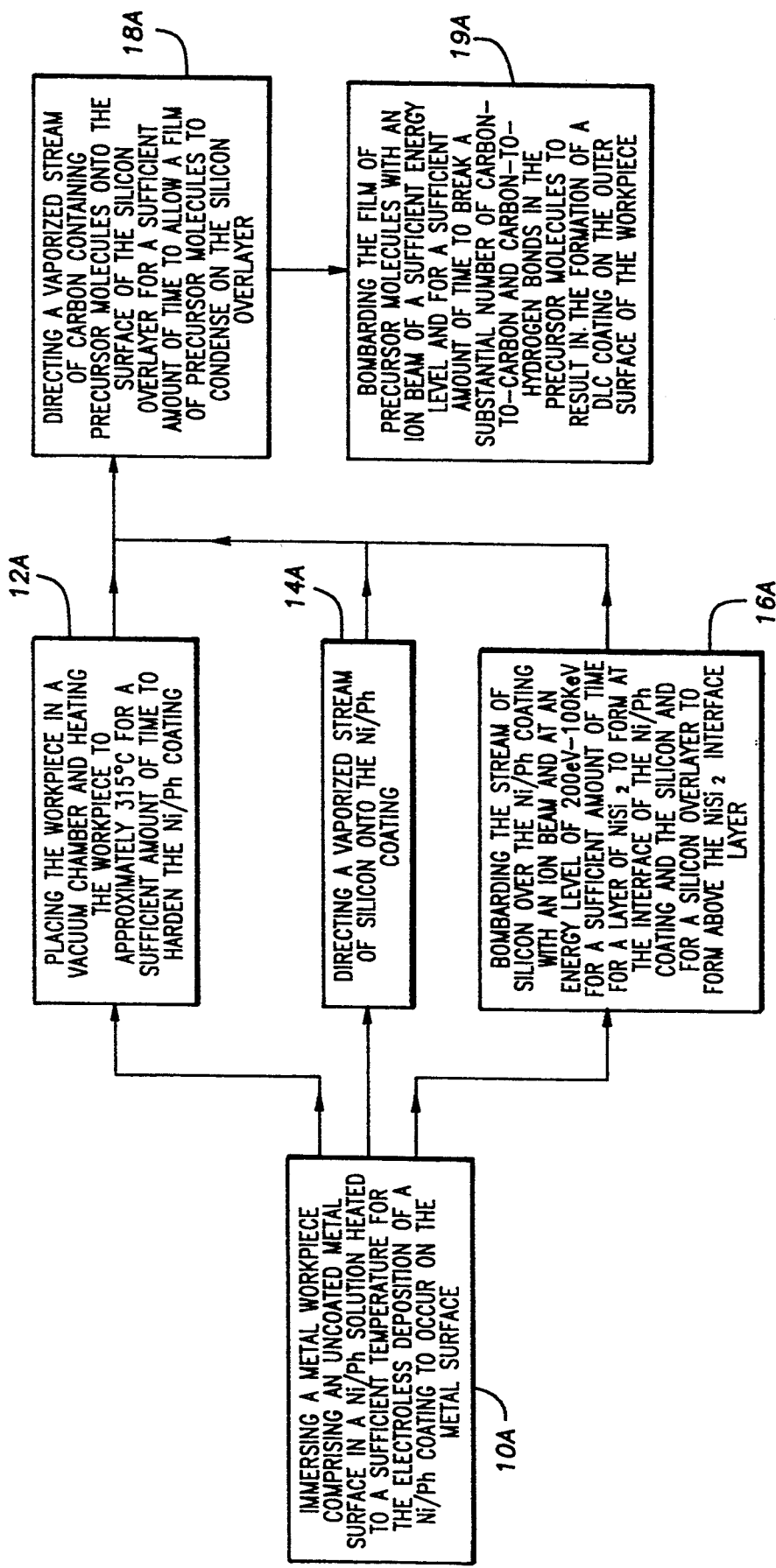

The second step of the method of practicing the present invention comprises placing the workpiece in a vacuum chamber and heating the workpiece to approximately 315° C. for a sufficient amount of time to harden the Ni/P coating, as shown in block 12A of FIG. 1A. It is preferable to heat the workpiece in this manner for approximately three hours. This heating step increases the hardness of the Ni/P coating.

Simultaneously with the heating of the workpiece, as described above, a vaporized stream of silicon is directed onto the Ni/P coating, as shown in block 14A of FIG. 1A. In a preferred embodiment, the vaporized stream of silicon originates in an electron beam heated hearth 30, of the type shown in FIG. 2. The quantity of silicon deposited can be measured by the frequency charge of a quartz crystal oscillator.

The preferred electron beam heated hearth comprises a magnetic deflection system 32 which causes electrons to travel in an arc of approximately 270° from the thermoionically emitting filament 36 to the unevaporated coating material 31. The electron beam is focused by shield 34. As shown in FIG. 2, a vapor 33 rises from the electron beam heated hearth toward the Ni/P coating. In a preferred embodiment, the vaporized stream of silicon emitted from the electron beam heated hearth is directed at a substantially right angle to the surface of the Ni/P coating.

Simultaneously with the heating and directing of a vaporized stream of silicon, as described above, the present invention comprises the step of bombarding the stream of silicon over the Ni/P coating with an ion beam 22 at an energy level of 200 eV -100 KeV for a sufficient amount of time for a layer of $NiSi_2$ to form at the interface of the Ni/P coating and the silicon and for a silicon overlayer to form above the $NiSi_2$ interface layer, as shown in block 16A of FIG. 1A. The heating of the workpiece to 315° C. in a vacuum, simultaneously with the directing and bombarding steps described above, facilitates the formation of $NiSi_2$ and also inhibits the oxidation of nickel.

In a preferred embodiment, the ion beam 22 used to bombard the silicon comprises either nitrogen or argon and is emitted by ion gun 20. As shown in FIG. 2, in a preferred embodiment, the ion beam used to bombard the stream of silicon is aligned at approximately a 30° angle to the direction of the vaporized stream of silicon.

The next step of the invention comprises directing a vaporized stream of carbon containing precursor molecules onto the surface of the silicon overlayer for a sufficient amount of time to allow a film of precursor molecules to condense on the silicon overlayer, as shown in block 18A of FIG. 1A. In a preferred embodiment, a vaporized stream of carbon containing precursor molecules originates from a precursor fluid 42 in an electronically heated vessel. The precursor fluid may be oil. The electronically heated vessel is preferably made from stainless steel. This stream of molecules is directed toward the workpiece by a right angle nozzle 46 of the type shown in FIG. 3. The workpiece is mounted on a rotatable table 40 in vacuum chamber 41. The use of the rotatable table, as shown in FIG. 3, allows the workpiece to be placed in the path of ion beams or vapor streams originating from various locations and directions.

In a preferred embodiment, heating coils 44 can be used to heat the electronically heated vessel. In a preferred embodiment, the electronically heated vessel is heated to approximately 140° C. In one embodiment of the present invention, the precursor is polyphenyl ether. In another embodiment of the present invention, the precursor is polydimethyl siloxane.

As shown in FIG. 3, the carbon containing precursor molecules are directed at the workpiece in a substantially horizontal direction. In the present invention, the precursor deposition preferably takes place at a temperature below 100° C.

The next step of the present invention comprises bombarding the film of precursor molecules with an ion beam of a sufficient energy level and for a sufficient amount of time to break a substantial number of carbon-to-carbon and carbon-to-hydrogen bonds in the precursor molecules to result in the formation of a DLC coating on the outer surface of the workpiece, as shown in block 19A of the FIG. 1A. In a preferred embodiment, the ion beams used to bombard the film of precursor molecules comprise nitrogen ions at energy levels of approximately 10 KeV. As shown in FIG. 3, the ion beam 47 is emitted from an ion source 45 and directed toward the workpiece, mounted on rotatable table 40.

In a preferred embodiment, the present invention may further comprise the step of bombarding the DLC coating with an ion beam comprising fluorine. Such an ion beam may be produced from a source fed with $BF_3$ gas.

In an alternative embodiment, the present invention may further comprise the step of bombarding the DLC coating with an ion beam comprising sulfur. Such an ion beam may be produced from a source fed with $H_2S$ gas.

Figure 1B:
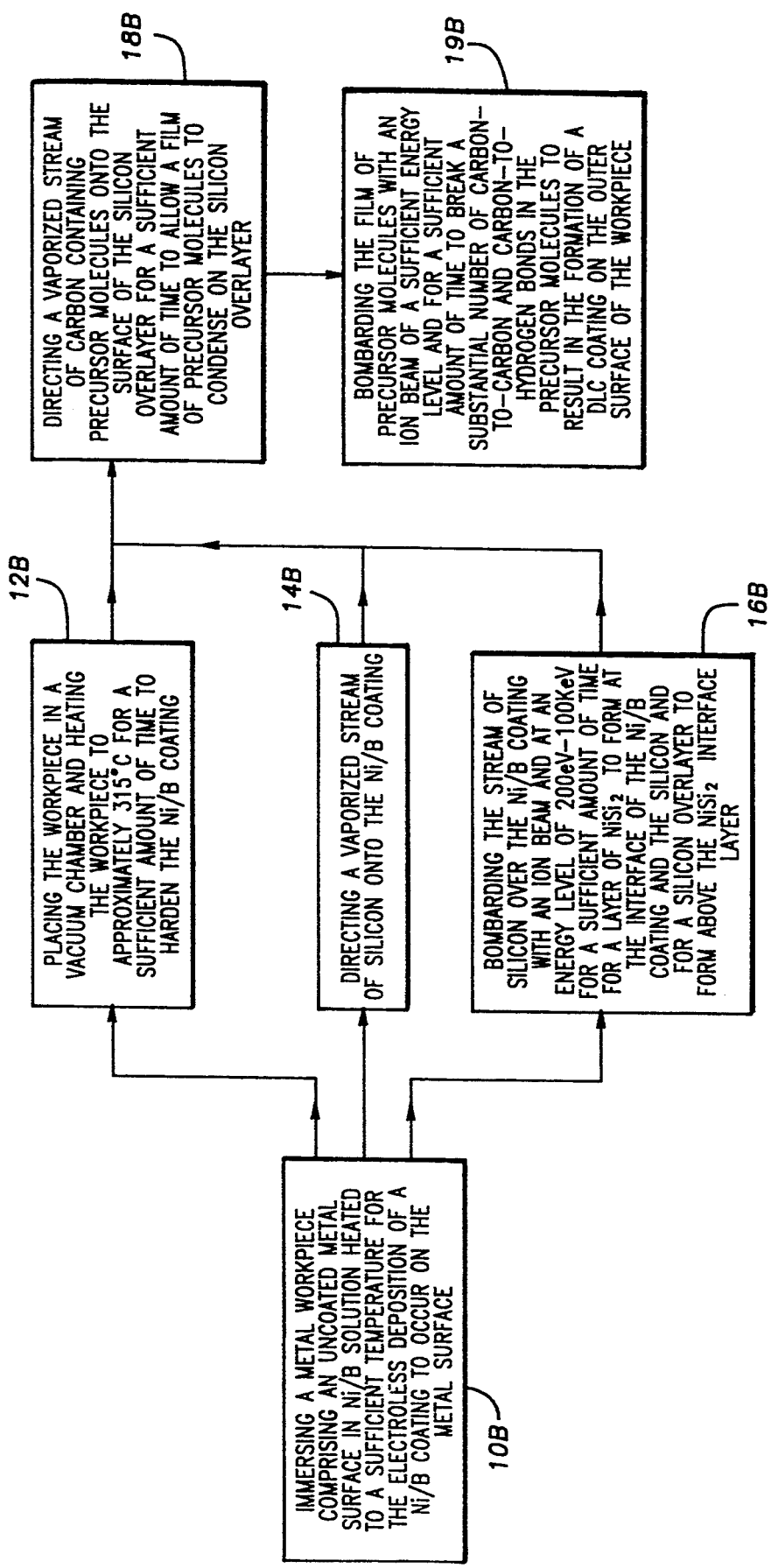

In an alternative embodiment of the present invention, the process is carried out using a Ni/B solution, rather than a Ni/P solution. All other steps in the process are the same. The Ni/B solution embodiment is depicted in FIG. 1B.

Figure 1C:
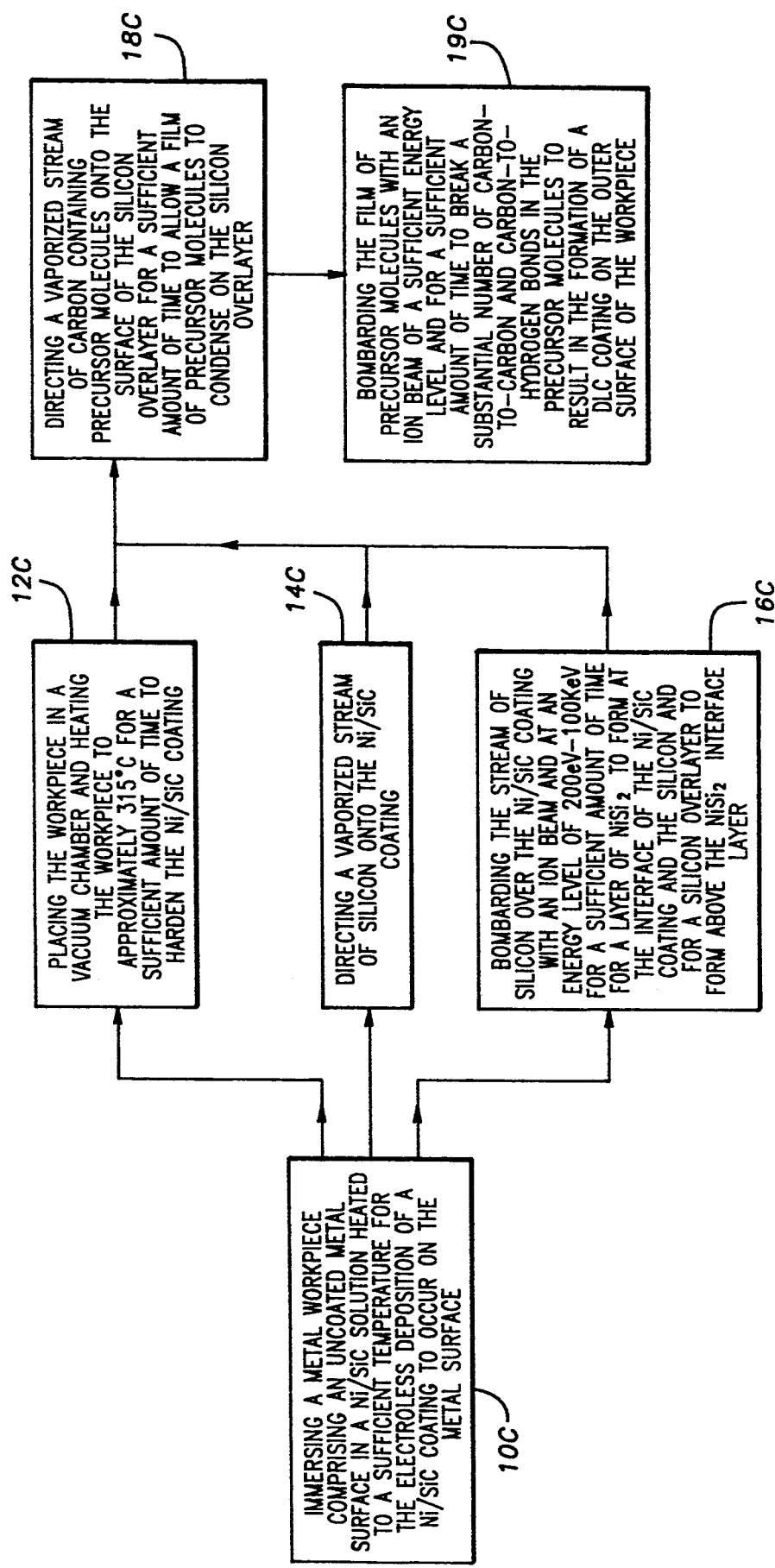

In another embodiment of the present invention, the process is carried out using a Ni/SiC solution, rather than a Ni/P solution. All other steps in the process are the same. The Ni/SiC solution embodiment of the present invention is depicted in FIG. 1C.

In yet another embodiment, germanium is used instead of silicon, as shown in FIG. 1D.

Many modifications and variations may be made in the embodiments described herein and depicted in the accompanying drawings without departing from the concept of the present invention. Accordingly, it is clearly understood that the embodiments described and illustrated herein are illustrative only and are not intended as a limitation upon the scope of the present invention.

What is claimed is:

1. A process for coating a metal surface, comprising the steps of:
   (a) immersing a metal workpiece comprising an uncoated metal surface in a Ni/P electroless deposition solution heated to a sufficient temperature that a Ni/P coating forms on the metal surface;
   (b) placing the workpiece in a vacuum chamber and heating the workpiece to approximately 315° C. for a sufficient amount of time to harden the Ni/P coating;
   (c) simultaneously with the heating step (b), directing a vaporized stream of silicon onto the Ni/P coating;
   (d) simultaneously with the heating and directing of steps (b) and (c), bombarding the stream of silicon over the Ni/P coating with an ion beam and at an energy level of 200 eV-100 KeV for a sufficient amount of time that a layer of $NiSi_2$ forms at the interface of the Ni/P coating and the silicon and that a silicon overlayer forms above the $NiSi_2$ interface layer;
   (e) directing a vaporized stream of carbon-containing precursor molecules having carbon-to-carbon and carbon-to-hydrogen bonds onto the surface of the silicon overlayer for a sufficient amount of time that a film of the precursor molecules condenses on the silicon overlayer; and
   (f) bombarding the film of precursor molecules with an ion beam of a sufficient energy level and for a sufficient amount of time that a sufficient number of the carbon-to-carbon and carbon-to-hydrogen bonds in the precursor molecules break to result in the formation of a diamond-like carbon coating on the silicon overlayer.

2. The process of claim 1, wherein the Ni/P solution is 3-12% phosphorus by atomic percent.

3. The process of claim 1, wherein the Ni/P solution comprises nickel sulfate, sodium hypophosphite, aminoacetic acid, acetic acid, and filtered water.

4. The process of claim 1, wherein the vaporized stream of silicon originates in an electron beam heated hearth.

5. The process of claim 1, wherein the ion beam used to bombard the stream of silicon over the Ni/P coating is aligned at approximately a 30° angle to the direction of the vaporized stream of silicon.

6. The process of claim 5, wherein the vaporized stream of silicon is directed at a substantially right angle to a surface of the Ni/P coating.

7. The process of claim 1, wherein the ion beam used to bombard the silicon comprises nitrogen.

8. The process of claim 1, wherein the ion beam used to bombard the silicon comprises argon.

9. The process of claim 1, wherein the heating of the workpiece to approximately 315° C. is for approximately three hours.

10. The process of claim 1, wherein the precursor is polydimethyl siloxane.

11. The process of claim 1, wherein the vaporized stream of precursor molecules originates from a vessel electrically heated to approximately 140° C.

12. The process of claim 1, wherein the precursor is polyphenyl ether.

13. The process of claim 1, wherein the step of directing a vaporized stream of carbon-containing precursor molecules takes place at a temperature below 100° C.

14. The process of claim 1, wherein the ion beam used to bombard the film of precursor molecules comprises nitrogen ions at energy levels of approximately 10 KeV.

15. The process of claim 1, further comprising the step of bombarding the diamond-like carbon coating with an ion beam comprising fluorine.

16. The process of claim 1, further comprising the step of bombarding the diamond-like carbon coating with an ion beam comprising sulfur.

17. A process for coating a metal surface, comprising the steps of:
   (a) immersing a metal workpiece comprising an uncoated metal surface in a Ni/B electroless deposition solution heated to a sufficient temperature that a Ni/B coating forms on the metal surface;
   (b) placing the workpiece in a vacuum chamber and heating the workpiece to approximately 315° C. for a sufficient amount of time to harden the Ni/B coating;
   (c) simultaneously with the heating step (b), directing a vaporized stream of silicon onto the Ni/B coating;
   (d) simultaneously with the heating and directing of steps (b) and (c), bombarding the stream of silicon over the Ni/B coating with an ion beam and at an energy level of 200 eV-100 KeV for a sufficient amount of time that a layer of $NiSi_2$ forms at the interface of the Ni/B coating and the silicon and that a silicon overlayer forms above the NiSi$_2$ interface layer;

(e) directing a vaporized stream of carbon-containing precursor molecules having carbon-to-carbon and carbon-to-hydrogen bonds onto the surface of the silicon overlayer for a sufficient amount of time that a film of the precursor molecules condenses on the silicon overlayer; and (f) bombarding the film of precursor molecules with an ion beam of a sufficient energy level and for a sufficient amount of time that a sufficient number of the carbon-to-carbon and carbon-to-hydrogen bonds in the precursor molecules break to result in the formation of a diamond-like carbon coating on the silicon overlayer.

18. The process of claim 17, wherein the Ni/B solution is 5% boron by atomic weight.

19. A process for coating a metal surface, comprising the steps of:

(a) immersing a metal workpiece comprising an uncoated metal surface in a Ni/SiC electroless deposition solution heated to a sufficient temperature that a Ni/SiC coating forms on the metal surface;

(b) placing the workpiece in a vacuum chamber and heating the workpiece to approximately 315° C. for a sufficient amount of time to harden the Ni/SiC coating;

(c) simultaneously with the heating step (b), directing a vaporized stream of silicon onto the Ni/SiC coating;

(d) simultaneously with the heating and directing of steps (b) and (c), bombarding the stream of silicon over the Ni/SiC coating with an ion beam and at an energy level of 200 eV–100 KeV for a sufficient amount of time that a layer of NiSi$_2$ forms at the interface of the Ni/SiC coating and the silicon and that a silicon overlayer forms above the NiSi$_2$ interface layer;

(e) directing a vaporized stream of carbon-containing precursor molecules having carbon-to-carbon and carbon-to-hydrogen bonds onto the surface of the silicon overlayer for a sufficient amount of time that a film of the precursor molecules condenses on the silicon overlayer; and (f) bombarding the film of precursor molecules with an ion beam of a sufficient energy level and for a sufficient amount of time that a sufficient number of the carbon-to-carbon and carbon-to-hydrogen bonds in the precursor molecules break to result in the formation of a diamond-like carbon coating on the silicon overlayer.

20. The process of claim 1, wherein the Ni/SiC solution is 25% SiC by volume.

21. A process for coating a metal surface, comprising the steps of:

(a) immersing a metal workpiece comprising an uncoated metal surface in a Ni/P electroless deposition solution heated to a sufficient temperature that a Ni/P coating forms on the metal surface;

(b) placing the workpiece in a vacuum chamber and heating the workpiece to approximately 315° C. for a sufficient amount of time to harden the Ni/P coating;

(c) simultaneously with the heating step (b), directing a vaporized stream of germanium onto the Ni/P coating;

(d) simultaneously with the heating and directing of steps (b) and (c), bombarding the stream of germanium over the Ni/P coating with an ion beam and at an energy level of 200 eV–100 KeV for a sufficient amount of time that a layer of NiGe$_2$ forms at the interface of the Ni/P coating and the germanium and that a germanium overlayer forms above the NiGe$_2$ interface layer;

(e) directing a vaporized stream of carbon-containing precursor molecules having carbon-to-carbon and carbon-to-hydrogen bonds onto the surface of the germanium overlayer for a sufficient amount of time that a film of the precursor molecules condenses on the germanium overlayer; and (f) bombarding the film of precursor molecules with an ion beam of a sufficient energy level and for a sufficient amount of time that a sufficient number of the carbon-to-carbon and carbon-to-hydrogen bonds in the precursor molecules break to result in the formation of a diamond-like carbon coating on the germanium overlayer.

22. The process of claim 21, wherein the vaporized stream of germanium originates in an electron beam heated hearth.

23. The process of claim 21, wherein the ion beam used to bombard the stream of germanium over the Ni/P coating is aligned at approximately a 30° angle to the direction of the vaporized stream of germanium.

* * * * *